United States Patent [19]

Sakata

[11] Patent Number: 5,230,022
[45] Date of Patent: Jul. 20, 1993

[54] LOW FREQUENCY COMPENSATING CIRCUIT FOR AUDIO SIGNALS

[75] Inventor: Haruo Sakata, Tokyo, Japan
[73] Assignee: Clarion Co., Ltd., Tokyo, Japan
[21] Appl. No.: 717,092
[22] Filed: Jun. 18, 1991

[30] Foreign Application Priority Data

Jun. 22, 1990 [JP] Japan .................... 2-162841

[51] Int. Cl.$^5$ ............................. H03G 5/00
[52] U.S. Cl. ............................. 381/98; 381/97
[58] Field of Search .............. 381/97, 99, 17, 98, 381/59, 100

[56] References Cited

FOREIGN PATENT DOCUMENTS

| | | |
|---|---|---|
| 58-18840 | 5/1977 | Japan . |
| 59-18920 | 6/1977 | Japan . |
| 62-35320 | 1/1981 | Japan . |
| 57-54400 | 11/1982 | Japan . |
| 62-5713 | 12/1987 | Japan . |
| 1-34239 | 10/1989 | Japan . |

Primary Examiner—Forester W. Isen
Attorney, Agent, or Firm—Flynn, Thiel, Boutell & Tanis

[57] ABSTRACT

A low frequency compensating circuit for audio signals is disclosed, which comprises frequency component separating means for separating an audio signal coming from a predetermined audio signal source into a low frequency component signal under a predetermined frequency and a high frequency component signal over the predetermined frequency to output separately the low frequency component signal and the high frequency component signal; variable delaying means for delaying the low frequency component signal so that delay time increases with increasing frequency; fixed delaying means for delaying the high frequency component signal by a fixed delay time, which is almost equal to the delay time set for the predetermined frequency by the variable delaying means; and synthesizing means for combining delayed signals outputted by the two delaying means. In this way, clearness and crispness are obtained for the low frequency region and at the same time sound doesn't become unnatural for the high frequency region.

8 Claims, 5 Drawing Sheets $\cos w_1 t + 0.3 \cos 3 w_1 t$ $\cos w_1 t + 0.3 \cos(w_1 t + \phi)$

LOW FREQUENCY COMPENSATING CIRCUIT FOR AUDIO SIGNALS

FIELD OF THE INVENTION

The present invention relates to a low frequency compensating circuit for audio signals and in particular to a circuit capable of improving audio response characteristics for the low frequency component at reproduction of audio signals.

BACKGROUND OF THE INVENTION

For the reproduction of audio signals, in general, frequency-amplitude characteristics are made often flat or frequency-phase characteristics are made linear. Emphasis of low frequency sound was effected only by amplifying the low frequency component and although sound volume was increased at the low frequency, clearness and crispness were not able to be obtained.

In general, it is known that the auditory sense of a human being has different sensitive times, depending on the frequency of sound. As indicated in FIG. 8, the sensitive time becomes longer with decreasing frequency and shorter with increasing frequency. For this reason, even sharp transient sound is sensed as not so sharp sound, as the frequency decreases, when it is heard by ears.

Heretofore almost no compensation of the phase characteristics (with respect to the frequency) was effected in an audio signal transmitting system. As a ground therefor it is cited that the auditory sense of a human being is almost not sensitive to the phase. For example, synthesis of a fundamental wave with a third harmonic wave is as indicated in FIGS. 11A and 11B. Although the relations in the phase between the fundamental wave and the third harmonic wave are different for FIGS. 11A and 11B, it is known that the difference on the auditory sense therebetween is small.

However recently physiological and psychological researches on the auditory sense have been progressed so that it is possible to measure delay time vs. frequency characteristics of the auditory sense.

FIG. 12 shows an example of physiological experiments on the auditory sense of a cat (refer to de Boer: "Synthetic whole nerve action potentials", J. Acoust. Soc. Am., Vol. 58, No. 5, pp. 1034, Nov. 1975) and FIG. 8 shows an example of results measured by the inventors of the present invention. In either of them, the delay time is shorter for higher frequency than for lower frequency. This means that the signal of the waveform indicated in FIG. 11A is perceived in a same manner as the signals of the waveform indicated in FIG. 11B.

In a wide band audio signal system it is sufficient to take not so seriously the phase characteristics of the auditory sense described above into account. The magnitude of different frequency components remains almost unchanged, when original sounds are heard directly and when sounds outputted by a wide band signal system are heard. It is common to both the cases that the low frequency component is heard with some delay and it is unnecessary to vary specifically the phase characteristics of the signal system.

However, in a narrow band signal transmitting system, of course the high frequency component of the signal is dropped out or attenuated and reproduced sound is far from reproduction of the original sound with high fidelity. It is for this reason that middle wavelength AM radio is heard with less clearness and crispness than FM. That is, sound reproduced by a prior art narrow band signal transmitting system had a drawback that rise of the waveform is worse, as indicated in FIG. 11B, when it is made pass through the auditory sense.

In order to remove the drawback described above, the inventors of the present invention has proposed previously a circuit, in which the delay characteristics are varied over the whole audio frequency, depending on the frequency, in Japanese patent application No. 60-14496 (JP-P-62-5713A).

In the invention of the previous application described above, e.g. a circuit indicated in FIG. 10 was used in order that higher frequency components are delayed more than lower frequency components so that relative perception time difference is removed over the whole audio frequency band.

In FIG. 10, reference numerals 27 is a frequency separator; 28 is a delaying circuit consisting of a plurality of delay lines having different delay times; and 29 is an adder.

An audio signal is separated by the frequency separator 27 into N channels of frequency bands. The signal thus separated in the different frequency bands is again synthesized by the adder 29 through the delaying circuit 28. In this case, since the signal is delayed so that higher frequency components are delayed by longer delay times, frequency-delay time characteristics of the auditory sense are compensated.

However, the construction described above had a drawback that although clearness and crispness are obtained for the low frequency region, transient sound becomes sharp in the waveform in the higher frequency region and the sound is unnatural.

OBJECT OF THE INVENTION

The present invention has been done in order to solve the problems of the prior art technique and the object thereof is to provide a low frequency compensating circuit for audio signals, by which clearness and crispness are obtained for the low frequency region and at the same time sound doesn't become unnatural for the high frequency region.

SUMMARY OF THE INVENTION

In order to achieve the above object, a low frequency compensating circuit for audio signals according to the present invention comprises:

frequency component separating means for separating an audio signal coming from a predetermined audio signal source into a low frequency component signal under a predetermined frequency and a high frequency component signal over the predetermined frequency to output separately the low frequency component signal and the high frequency component signal;

variable delaying means for delaying the low frequency component signal so that delay time increases with increasing frequency;

fixed delaying means for delaying the high frequency component signal by a fixed delay time, which is almost equal to the delay time set for the predetermined frequency by the variable delaying means; and synthesizing means for combining delayed signals outputted by the two delaying means.

In the compensating circuit described above, frequency separating means separates frequency components of the inputted audio signal into a low frequency component signal and a high frequency component signal across the predetermined frequency.

That is, the low frequency signal is inputted in the variable delaying means, in which the delay time increases with increasing frequency of the signal. On the other hand, the high frequency signal is inputted in the fixed delaying means, which delays the signal by a fixed delay time, which is almost equal to the delay time set for the predetermined frequency by the variable delaying means.

Then the output signals of the variable delaying means and the fixed delaying means are combined by the signal synthesizing means to be outputted. For this output signal, the delay time increases with increasing frequency for the low frequency signal and it remains constant for the high frequency signal. In this way, it is possible to improve the response characteristics on the auditory sense at the reproduction of low frequency sounds and sounds, which are clear and crisp, having sharp rise in transient sound, can be obtained in the low frequency region.

BRIEF DESCRIPTION OF THE DRAWINGS

FIG. 12 is a graph indicating an example of frequency-delay time characteristics of the auditory sense.

DETAILED DESCRIPTION

Figure 1:
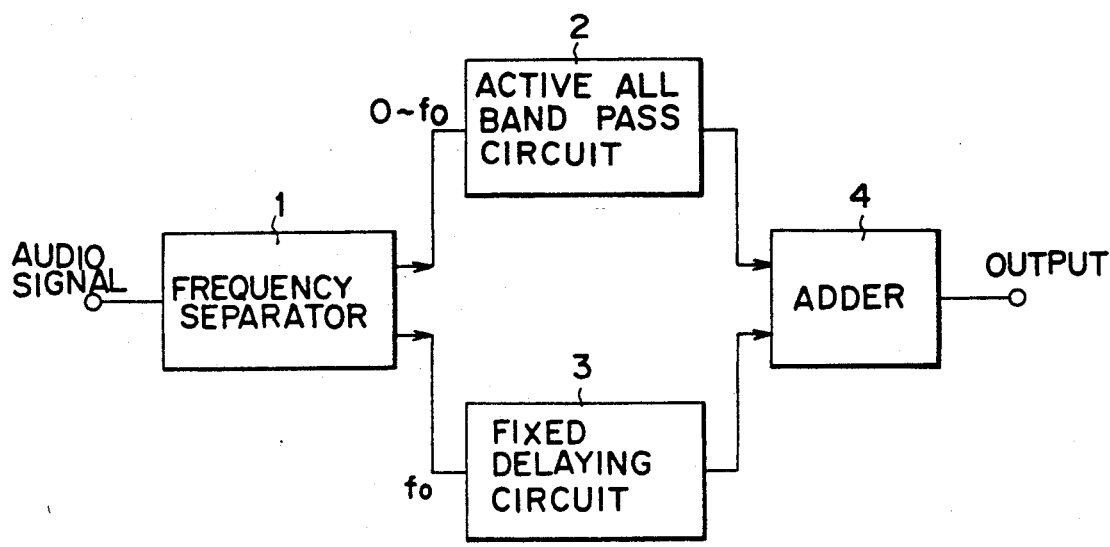
FIG. 1 is a block diagram indicating an embodiment of the low frequency compensating circuit for audio signals according to the present invention.

Hereinbelow an embodiment of the present invention will be explained, referring to the drawings.

FIG. 1 is a block diagram indicating an embodiment of the low frequency compensating circuit for audio signals according to the present invention. As indicated in this figure, this compensating circuit consists of a frequency separator 1 acting as frequency component separating means, an active all band pass circuit 2 acting as variable delaying means, a fixed delaying circuit 3 acting as fixed delaying means, and an adder 4 acting as synthesizing means.

An audio signal is inputted in the frequency separator 1. This frequency separator 1 is so constructed that the audio signal is separated into a low frequency component under a predetermined frequency $f_0$ and a high frequency component over the predetermined frequency $f_0$. In the present embodiment the predetermined frequency $f_0$ is chosen at about 500Hz to 2KHz.

The low frequency component is inputted in the active all band pass circuit 2, in which it is delayed, depending on the frequency. That is, the active all band pass circuit 2 is so constructed that the delay time increases with increasing frequency and that the delay time is longest, which is $\tau f_0$, at the predetermined frequency $f_0$.

On the other hand, the high frequency component is inputted in the fixed delaying circuit 3, where it is delayed by a time, which is approximately equal to the delay time $\tau f_0$ for the predetermined frequency $f_0$ in the active all band pass circuit 2.

The output signals of the active all band pass circuit 2 and the fixed delaying circuit 3 are sent to the adder 4 to be combined there and a delayed synthesized signal, in which rise of transient sound in the low frequency region of the audio signal is sharp, is outputted.

Figure 2:
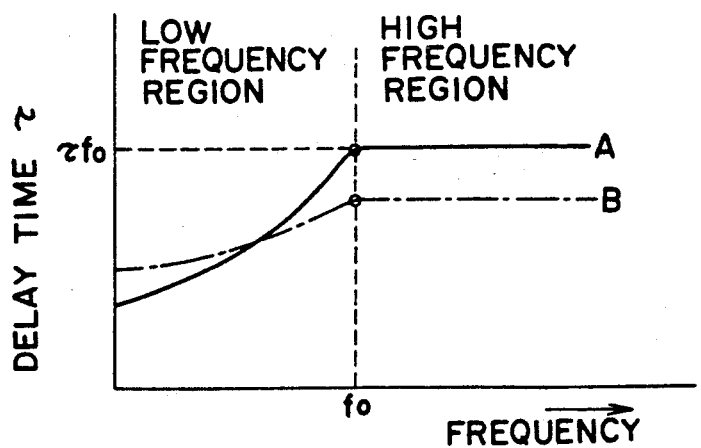
FIG. 2 is a graph indicating frequency-delay time characteristics of the circuit indicated in FIG. 1.

FIG. 2 indicates frequency-delay time characteristics of the output of the adder 4 thus constructed. As it can be understood from this figure, in the low frequency region under the predetermined frequency $f_0$, the delay time is increased by the active all band pass circuit 2 with increasing frequency and the delay time is longest, which is $\tau f_0$, at the predetermined frequency $f_0$ On the other hand, over the predetermined frequency $f_0$, the delay time is kept at a constant value, which is almost equal to the delay time $\tau f_0$, as indicated by a full line A or a dot-dashed line B in FIG. 2. Owing to these characteristics clear and crisp sound can be obtained in the low frequency region and in addition, unnatural feeling is excluded owing to the fact that the delay time is constant in the high frequency region.

Now the concrete construction of the frequency separator 1, the active all band pass circuit 2 and the fixed delaying circuit 3 will be explained in detail.

Figure 3:
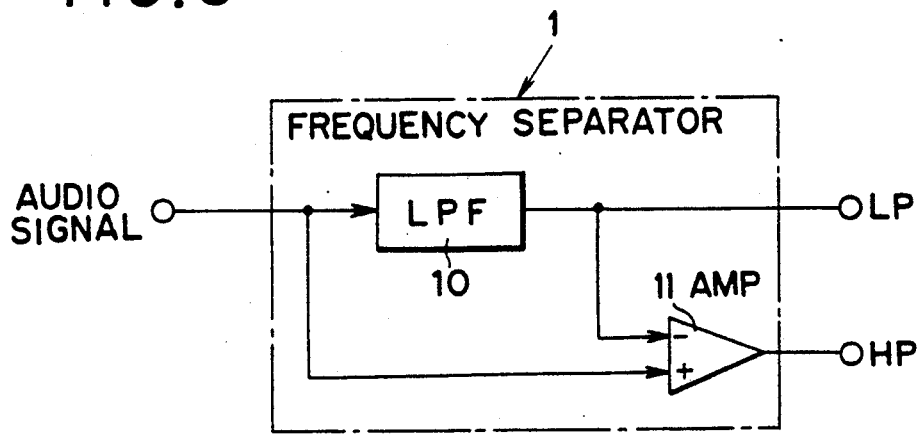
FIGS. 3 and 9 are block diagrams indicating concrete examples of the frequency separator.
Figure 4:
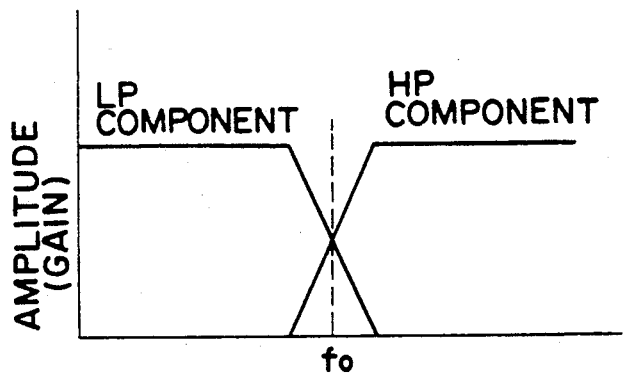
FIG. 4 is a graph indicating output characteristics of the frequency separator indicated in FIG. 3.
Figure 9:
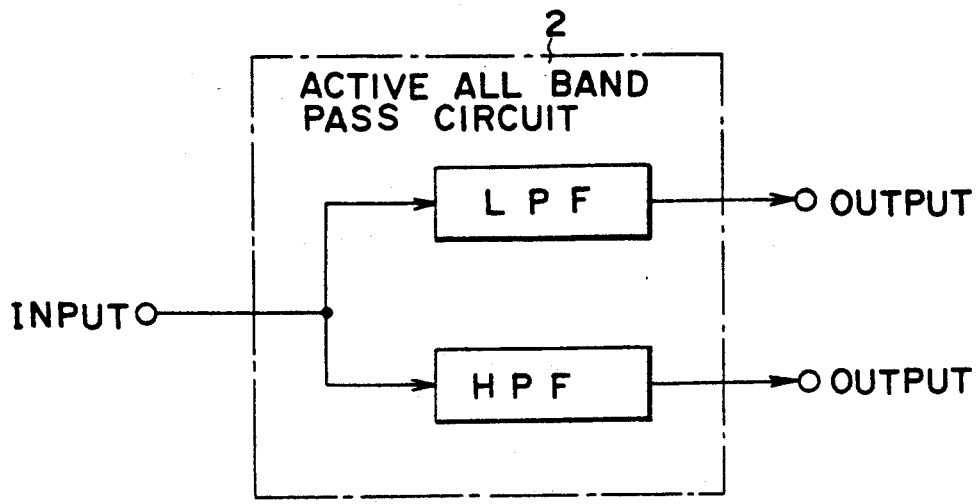
Figure 10:
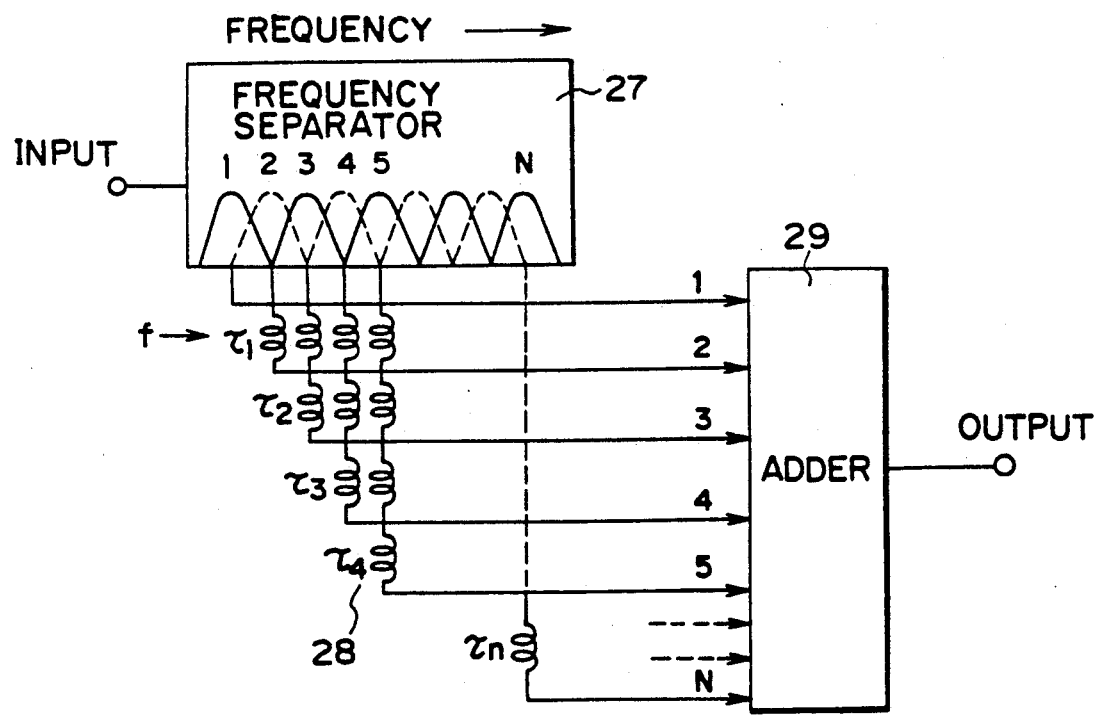
FIG. 10 is a block diagram indicating an example of a prior art compensating circuit.
Figure 11A:
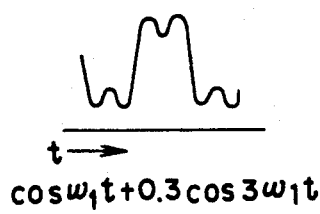
FIGS. 11A and 11B indicate synthesized waveform of a fundamental wave and a third harmonic wave.
Figure 11B:
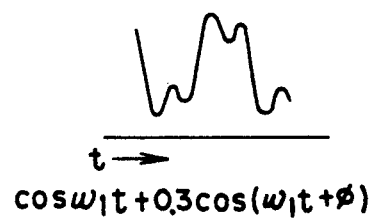
Figure 12:
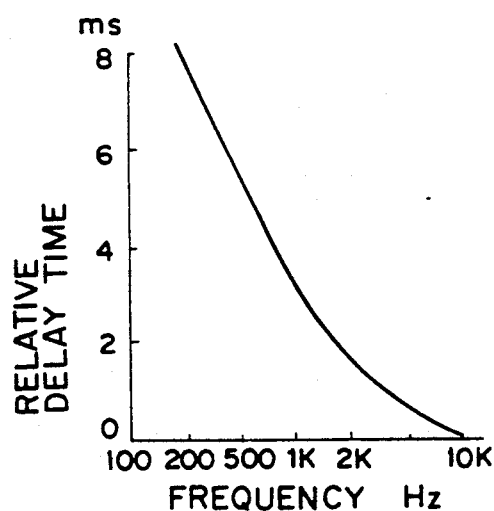

At first, as indicated in FIG. 9, the frequency separator 1 may consist of a low pass filter LPF and a high pass filter HPF having frequency-amplitude characteristics, whose curves intersect each other at the predetermined frequency $f_0$, as indicated in FIG. 4. In practice, it is difficult to obtain flat characteristics indicated in FIG. 4. Therefore, in order to obtain flatter frequency characteristics, the frequency separator 1 may be constructed as indicated in FIG. 3. In this example, a low pass filter 10 and a differential amplifier 11 are used therefor. The audio signal is inputted in the low pass filter 10 to obtain an output of the low pass filter LPF in the predetermined low frequency region and at the same time the output signal and the audio signal stated above are inputted in the differential amplifier 11 to subtract the output signal of the LPF stated above from the audio signal. In this way an output signal equivalent to the output of the high pass filter HPF can be obtained. By using the construction indicated in FIG. 3, it is possible to obtain flat frequency characteristics, by which the amplitude remains almost constant, as indicated in FIG. 4.

Figure 5:
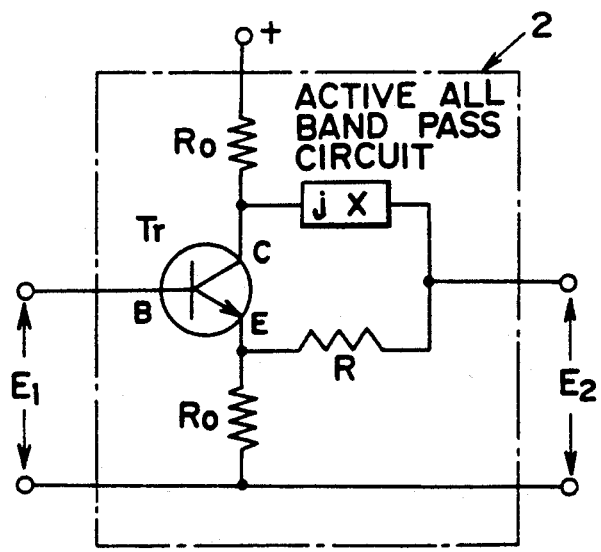
FIG. 5 is a block diagram indicating a concrete example of the active all band pass circuit.

Next an example of the active all band pass circuit 2 is indicated in FIG. 5. In the figure, Tr is a transistor and the low frequency component signal $E_1$ separated from the audio signal is applied to the base thereof. Further resistors $R_0$ are connected with the collector and the emitter thereof, respectively. In addition, an inductance $jx$ and a resistor R are connected with the collector and the emitter, respectively and a variable delayed output signal $E_2$ is taken out from the connecting point J of the resistor R and the inductance $jx$.

Figure 6:
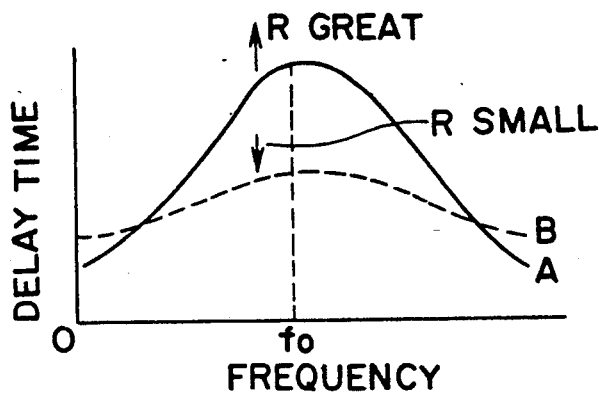
FIG. 6 is a graph indicating output characteristics of the circuit indicated in FIG. 5.
Figure 13:
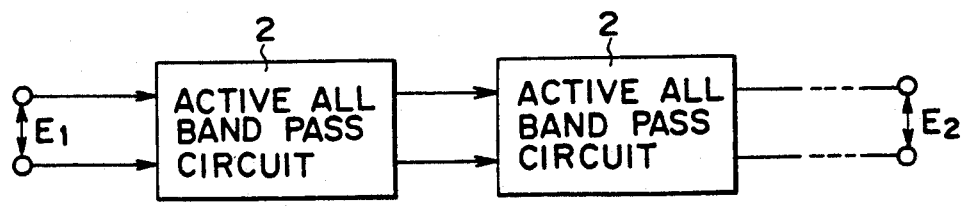
FIG. 13 is a block diagram indicating an example of the variable delaying means.

The circuit indicated in FIG. 5 has flat frequency-amplitude characteristics and the delay time of $E_2$ with respect to $E_1$ increases approximately proportionally to the increase in the frequency in the region between 0 and the predetermined frequency $f_0$. FIG. 6 indicates these frequency-delay time characteristics. Here it is so constructed that the longest delay time is obtained at the predetermined frequency $f_0$. Further this circuit is so constructed that the delay time characteristics are varied, depending on the magnitude of R. In this way the characteristics can be varied, as indicated by A and B in FIG. 6, by varying R. In the case where no satisfactory delay time is obtained, a necessary number of circuits 2 indicated in FIG. 5 may be used, connected in series, as indicated in FIG. 13.

Figure 7:
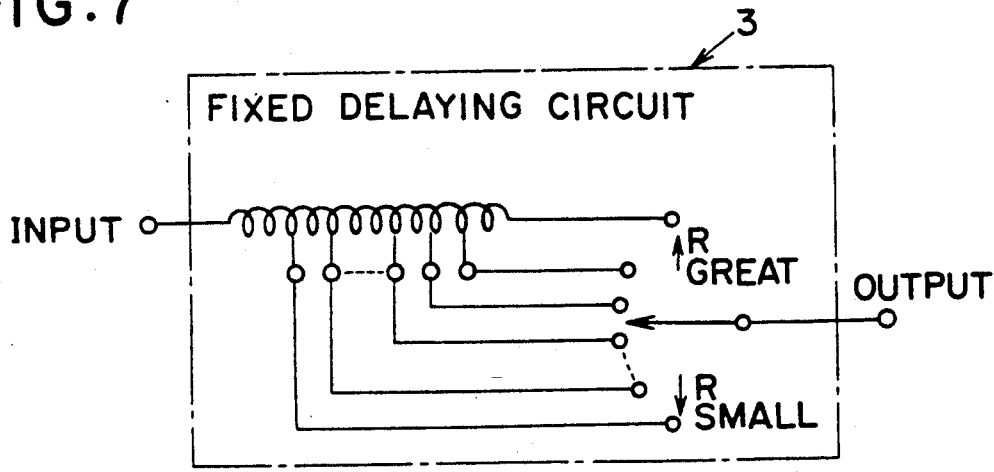
FIG. 7 is a circuit diagram indicating a concrete example of the fixed delaying circuit.
Figure 8:
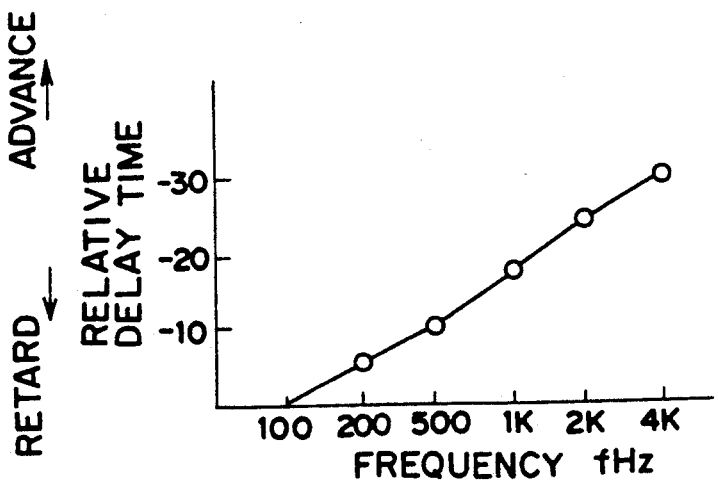
FIGS. 8 and 12 are graphs indicating frequency-delay time characteristics of the auditory sense.

Now an example of the fixed delaying circuit 3 will be explained, referring to FIG. 7. This circuit 3 constitutes a delaying circuit composed of a delay line having a plurality of taps $TP_1 \sim TP_n$, as indicated in the figure. By selecting one of these taps it is possible to adjust the fixed delay time to the longest delay time $\tau f_0$ at the predetermined frequency $f_0$ in the low frequency region, which is set by the variable delaying means 2. In this way it is possible to obtain the frequency-delay time characteristics, as indicated in FIG. 2.

As explained above, according to the present embodiment, rise of the transient sound in the low frequency region under the predetermined frequency by the auditory sense is sharp, as indicated by the characteristic curve in FIG. 2 and it is possible to obtain clear and crisp sound of low frequency. At the same time, since the delay time is constant in the high frequency region over the predetermined frequency $f_0$, sharpness in the waveform disappears and thus it is possible to obtain natural sound.

As explained above, by the low frequency compensating circuit for audio signals, owing to the fact that the audio signal is separated into the low frequency component signal and the high frequency component signal, clear and crisp sound of low frequency can be obtained by means of the variable delaying means increasing the delay time with increasing frequency of the low frequency component signal. Since at the same time, in the high frequency region, the signal is delayed by a delay time, which is approximately equal to the delay time at the predetermined frequency obtained by the variable delaying means described above, sharpness in the waveform disappears and it is possible to obtain natural sound.

What is claimed is:

1. A low frequency compensating circuit for audio signals comprising:
   frequency component separating means for separating an audio signal coming from a predetermined audio signal source into a low frequency component signal below a predetermined frequency and a high frequency component signal over said predetermined frequency to output separately said low frequency component signal and said high frequency component signal;
   variable delaying means for delaying only said low frequency component signal by a delay time which increases with increasing frequency;
   fixed delaying means for delaying said high frequency component signal by a fixed delay time, which is substantially equal to the delay time set for said predetermined frequency by said variable delaying means; and
   synthesizing means for combining delayed signals outputted by said fixed and variable delaying means to provide a combined delay signal.

2. A low frequency compensating circuit for audio signals according to claim 1 wherein said frequency component separating means includes:
   a low pass filter for outputting said low frequency component signal below said predetermined frequency in response to said inputted audio signal; and
   a differential amplifier, which subtracts said low frequency component signal from said inputted audio signal to output said high frequency component signal over said predetermined frequency.

3. A low frequency compensating circuit for audio signals according to claim 1 wherein said variable delaying means is an active all band pass filter including:
   a transistor having a base, to which said low frequency component signal is applied;
   a resistor connected with the emitter of said transistor; and
   an inductance connected with the collector of said transistor, said inductance having an end remote from the collector which is connected at a connecting point to an end of said resistor remote from said emitter;
   wherein a delayed output signal is taken out from the connecting point of said resistor and said inductance.

4. A low frequency compensating circuit for audio signals according to claim 1 wherein said fixed delaying means includes:
   an input terminal, to which said high frequency component signal is applied; and
   a plurality of delayed output terminals having different delay times;
   wherein the delayed signal is taken out from one of said output terminals with a delay time, which is substantially equal to the delay time set for said predetermined frequency by said variable delaying means.

5. A low frequency compensating circuit for audio signals according to claim 1 wherein said predetermined frequency is in a frequency region between 500Hz and 2KHz.

6. A low frequency compensating circuit for audio signals according to claim 3 wherein a plurality of said active all band pass filters are connected in series.

7. A low frequency compensating circuit for audio signals according to claim 3 wherein said active all band pass filter has its longest delay time at said predetermined frequency.

8. A low frequency compensating circuit for audio signals according to claim 1 wherein said frequency component separating means includes:
   a low pass filter for outputting said low frequency component signal below said predetermined frequency in response to said inputted audio signal; and
   a high pass filter for outputting said high frequency component signal over said predetermined frequency.

* * * * *

UNITED STATES PATENT AND TRADEMARK OFFICE
CERTIFICATE OF CORRECTION

PATENT NO. : 5 230 022
DATED : July 20, 1993
INVENTOR(S) : Haruo SAKATA

It is certified that error appears in the above-identified patent and that said Letters Patent is hereby corrected as shown below:

Column 6, line 65; after "quency" insert
---in response to said inputted
audio signal---.

Signed and Sealed this

Twenty-second Day of February, 1994

Attest:

BRUCE LEHMAN

Attesting Officer    Commissioner of Patents and Trademarks